US009002213B2

(12) United States Patent
Hu et al.

(10) Patent No.: US 9,002,213 B2
(45) Date of Patent: Apr. 7, 2015

(54) APPARATUS FOR POWER EQUALISATION AND PHASE CORRECTION

(75) Inventors: Wenfei Hu, Paignton (GB); Jonathan Stuart Drake, Paignton (GB)

(73) Assignee: Oclaro Technology Limited, Northamptonshire (GB)

( * ) Notice: Subject to any disclaimer, the term of this patent is extended or adjusted under 35 U.S.C. 154(b) by 191 days.

(21) Appl. No.: 13/639,510

(22) PCT Filed: Dec. 2, 2010

(86) PCT No.: PCT/EP2010/068754
§ 371 (c)(1),
(2), (4) Date: Nov. 21, 2012

(87) PCT Pub. No.: WO2011/124281
PCT Pub. Date: Oct. 13, 2011

(65) Prior Publication Data
US 2013/0064557 A1    Mar. 14, 2013

Related U.S. Application Data

(60) Provisional application No. 61/321,916, filed on Apr. 8, 2010.

(51) Int. Cl.
*H04B 10/508* (2013.01)
*H04B 10/50* (2013.01)
*H03H 11/16* (2006.01)

(52) U.S. Cl.
CPC ........... *H04B 10/5051* (2013.01); *H03H 11/16* (2013.01); *H04B 10/508* (2013.01)

(58) Field of Classification Search
CPC ............. H04B 10/5051; H04B 10/508; H04B 10/556; H04B 10/564; H03H 11/16

USPC .......................... 398/207, 201, 212, 192, 194
See application file for complete search history.

(56) References Cited

U.S. PATENT DOCUMENTS 4,876,744 A * 10/1989 Misaizu et al. ................ 455/326
5,724,459 A * 3/1998 Banba et al. ....................... 385/3
6,619,866 B1    9/2003 Sun et al.
(Continued)

FOREIGN PATENT DOCUMENTS

| JP | 2005-101944 A | 4/2005 |
| JP | 2006-074699 A | 3/2006 |
| JP | 2006-270774 A | 10/2006 |

OTHER PUBLICATIONS

Wu et al., Synchronization Monitoring of I/Q Data and Pulse Carving Misalignment for a Parallel-Type RZ-DQPSK Transmitter by Measuring RF Clock Tone/Low Frequency Power, IEEE Photonics Technology Letters, vol. 20, Issue 24, pp. 2138-2140, Dec. 15, 2008, Publisher: IEEE.

(Continued)

*Primary Examiner* — Leslie Pascal
(74) *Attorney, Agent, or Firm* — Fenwick & West LLP

(57) ABSTRACT

According to a first aspect of the present invention there is provided an apparatus for performing power equalization and phase correction of two signals (400). The apparatus comprises a first hybrid coupler (401) configured to operate as a power combiner, and a second hybrid coupler (402) configured to operate as a power divider, wherein the apparatus is configured to provide an output (406) of the first hybrid coupler as an input (407) to the second hybrid coupler.

9 Claims, 5 Drawing Sheets

(56) References Cited

U.S. PATENT DOCUMENTS

| | | | |
|---|---|---|---|
| 7,710,216 B2* | 5/2010 | Hamada et al. | 333/26 |
| 2003/0180027 A1* | 9/2003 | Oaknin et al. | 385/140 |
| 2005/0046843 A1 | 3/2005 | Doerr et al. | |
| 2009/0325481 A1* | 12/2009 | Mohebbi | 455/15 |
| 2010/0008680 A1* | 1/2010 | Chen et al. | 398/198 |
| 2010/0054756 A1 | 3/2010 | Nishihara et al. | |
| 2012/0229330 A1* | 9/2012 | Grebennikov et al. | 342/175 |

OTHER PUBLICATIONS

International Search Report and Written Opinion dated Mar. 15, 2011, for Intl. Appl. No. PCT/EP2010/068754, 10 pages.

Notice of Reasons for Rejection for Japanese Patent Application No. 2013-503017, Jan. 28, 2014, 2 Pages.

* cited by examiner

APPARATUS FOR POWER EQUALISATION AND PHASE CORRECTION

CROSS-REFERENCE TO RELATED APPLICATIONS

This application is a National Phase Entry of International Application No. PCT/EP2010/068754, filed on Dec. 2, 2010, which claims the benefit of U.S. Provisional Application No. 61/321,916, filed on Apr. 8, 2010.

FIELD OF THE INVENTION

This invention relates to an apparatus for power equalisation and phase correction of two signals. Particularly, but not exclusively, the invention relates to an apparatus for power equalisation and differential phase recovery of imperfect differential signals for driving a dual-driven Mach-Zehnder modulator (MZM) providing direct intensity modulation (IM).

BACKGROUND TO THE INVENTION

Phase-shift keying (PSK) is a digital modulation technique that conveys data by changing (i.e. modulating) the phase of a carrier signal. Essentially, binary digits (bits) are encoded by associating a discrete set of phases of the carrier signal with a particular pattern of bits, known as a symbol. In differential phase-shift keying (DPSK) it is the change in successive phases of the signal that is used to determine the bit pattern, rather than the actual phase of the signal at any point in time.

Binary phase-shift keying (BPSK) makes use of two distinct phases separated by 180°. However, this technique only allows for 1 bit to be encoded per symbol (i.e. providing a total of 2 bits for each complete wavelength) and so it is not suitable for high data-rate applications. Quadrature phase-shift keying (QPSK) employs four discrete phases and can be used to encode two bits per symbol by combining an in-phase wave (denoting 4 discrete bits—one per quarter wavelength—representing the first bits in each symbol) and a quadrature-phase wave, having a phase-shift of a quarter of a wavelength with respect to the in-phase wave (the quadrature-phase wave denoting a further 4 discrete bits, representing the second bits in each symbol). Thus, QPSK can be used to significantly increase a data rate when compared to BPSK. Both BPSK and QPSK can be implemented using differential PSK to form differential BPSK (DBPSK) and differential QPSK (DQPSK), respectively.

Advanced modulation formats are increasingly important in optical communications due to their ability to provide increased spectral efficiency, higher receiver sensitivity, and better tolerance to chromatic dispersion and nonlinear effects. In particular, return-to-zero (RZ) DQPSK has been shown to provide quite high system performance results.

FIG. 1 illustrates schematically an example of a RZ-DQPSK transmitter 100. The transmitter comprises a source 101 (e.g. a laser diode), a DQPSK modulator 102 and a pulse carver 103 driven by a clock source 110. The DQPSK modulator 102 comprises an input splitter 104 feeding two phase modulators 105, 106 arranged in parallel, and an output coupler 107. The phase modulators 105, 106 can be provided by two nested Mach-Zehnder Modulators (MZM). One arm of the DQPSK modulator 102 is also provided with a further quadrature phase modulator 108. The source 101 generates an optical carrier wave which is split by the splitter 104 and equally distributed to the two phase modulators 105, 106. Each of the phase modulators 105, 106 is driven by one of two binary drive signals generated by a pre-coder 109. The pre-coder 109 converts the data streams that are to be encoded into the relevant in-phase (I) and quadrature (Q) phase drive signals, with one of the two phase modulaltors being driven by the I drive signal whilst the other is driven by the Q drive signal. The quadrature phase modulator 108 then introduces a $\pi/2$ (90°) phase shift between the two optical signals, which puts them in quadrature to each other (i.e. such that they form separate I and Q components). The two optical signals are then combined in the output coupler 107 resulting in one of the four phase shifted symbols (i.e. $\pi/4$, $3\pi/4$, $5\pi/4$ and $7\pi/4$) of a non-return-to-zero (NRZ) DQPSK signal.

The pulse carver 103 is then used to produce a RZ-DQPSK signal by carving pulses out from the NRZ-DQPSK signal. The pulse carver 103 could also be placed before the DQPSK modulator. Typically, advanced RZ modulation requires that the pulse carver be implemented by a MZM that is driven by a clock source providing sinusoidal electrical clock signals. For example, 50% duty cycle RZ can be generated using a sinusoidal clock signals with a peak-to-peak amplitude of $V\pi$, a frequency corresponding to the symbol rate/data rate (i.e. baud-rate clock) and a phase offset of $-\pi/2$ radians (−90°).

For a dual-drive MZM pulse carver it is important that the two voltages driving the two arms are of equal power and of anti-phase. However, the imperfect nature of the transmission structures (i.e. RF cable, connector and PCB tracks), the amplifiers, and the source of the driving voltages leads to the generation of power imbalance and skew (i.e. temporal misalignment of the drive waveform) between the two driving voltages. In an attempt to mitigate these problems, transmitter circuits often employ a differential amplifier, or an amplifier on each arm of an MZM pulse carver. However, the inclusion of such active devices within a circuit is costly.

SUMMARY OF THE INVENTION

It is an aim of the present invention to provide an apparatus for power equalisation and phase correction of two signals that overcomes, or at least mitigates, the above-mentioned problems.

According to one aspect of the present invention there is provided an apparatus for performing power equalisation and phase correction of two signals. The apparatus comprises a first hybrid coupler configured to operate as a power combiner, and a second hybrid coupler configured to operate as a power divider. The apparatus is configured to provide an output of the first hybrid coupler as an input to the second hybrid coupler.

The first hybrid coupler may be configured to sum two signals and to output the sum of the two signals to the second hybrid coupler. The first hybrid coupler may be configured to sum two signals that are 180° out of phase. The second hybrid coupler may be configured to split a signal into two output signals of equal power. The second hybrid coupler may be configured to split a signal into two signals that are 180° out of phase.

One or both of the first hybrid coupler and the second hybrid coupler may be 180° hybrid couplers. One or both of the first hybrid coupler and the second hybrid coupler may be rat-race couplers.

According to another aspect of the present invention there is provided a method for performing power equalisation and phase correction of two signals. The method comprises providing the two signals as inputs to a first hybrid coupler configured to operate as a power combiner, and providing the output of the first hybrid coupler to a second rat-race coupler configured to operate as a power divider.

The first hybrid coupler may sum the two signals and output the sum of the two signals to the second hybrid coupler. The first hybrid coupler may sum two signals that are 180° out of phase. The second hybrid coupler may split the output of the first hybrid coupler and output two signals of equal power. The second hybrid coupler may the output of the first hybrid coupler into two signals that are 180° out of phase.

One or both of the first hybrid coupler and the second hybrid coupler may be 180° hybrid couplers. One or both of the first hybrid coupler and the second hybrid coupler may be rat-race couplers.

According to a further aspect of the present invention there is provided a pulse carver comprising a dual-driven Mach Zehnder modulator (MZM) and an apparatus according to the first aspect of the present invention, the apparatus being configured to provide two signals for driving the MZM.

According to another aspect of the present invention there is provided a method of operating a pulse carver. The method comprises performing power equalisation and phase correction of two signals according to the method of the second aspect of the present invention, and using the two signals to drive a dual-driven Mach Zehnder modulator (MZM).

According to a further aspect of the present invention there is provided a transmitter for generating a Return-to-Zero (RZ) data signal. The transmitter comprises a source for generating a carrier signal, a data modulator for generating a data signal by encoding data onto the carrier signal, and a pulse carver according to the third aspect of the present invention for performing RZ modulation of either the carrier signal or the data signal.

According to another aspect of the present invention there is provided a method of generating a Return-to-Zero (RZ) data signal. The method comprises generating a data signal by performing modulation of a carrier signal in order to encode data onto the carrier signal, and performing RZ modulation of the either the carrier signal or the data signal using a pulse carver operated according to the method of the fourth aspect of the present invention.

BRIEF DESCRIPTION OF THE DRAWINGS

Some embodiments of the present invention will now be described in detail with reference to the accompanying drawings, in which.

DETAILED DESCRIPTION OF CERTAIN EMBODIMENTS

It has been recognised here that a combination of two hybrid couplers can provide a means for performing power equalisation and skew correction of two signals.

Hybrid couplers are four-port directional couplers that can perform power combining and/or equal (3-dB) power splitting, and they come in two types, 90° (degree) or quadrature hybrids, and 180° hybrids. A signal applied to any one input of a 90° hybrid coupler will result in two equal amplitude signals that are 90° out of phase (i.e. a quadrant apart). A 90° hybrid coupler can also be used to sum two input signals.

A 180° hybrid coupler can be used to divide an input into two outputs of equal amplitude that are in-phase, or to divide an input into two outputs of equal amplitude that are 180° out-of-phase, in dependence upon which port is used as the input port. A 180° hybrid coupler can also be used to simultaneously output the sum and the difference of two inputs.

A 180° hybrid ring or rat-race coupler is a four-port directional coupler that can be used to sum two in-phase signals, to sum two signals that are phase shifted by $\pi$ radians (180°), to equally split an input signal with no resultant phase difference between two outputs, or to equally split an input signal with a $\pi$ radians (180°) phase difference between two outputs.

Figure 1:
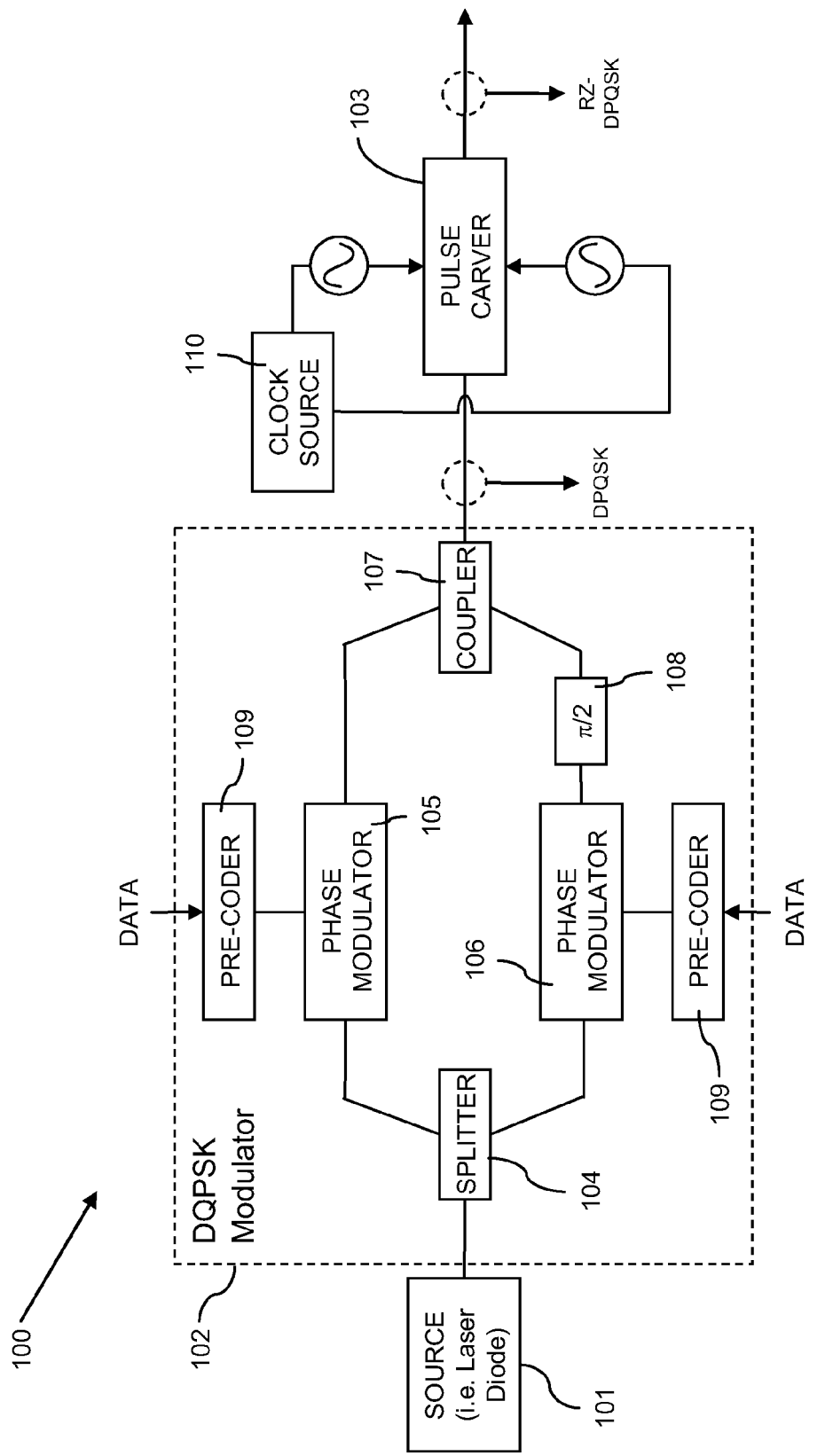
FIG. 1 illustrates schematically an example of a Return-to-Zero Differential Quadrature Phase-Shift Keying transmitter.
Figure 3B:
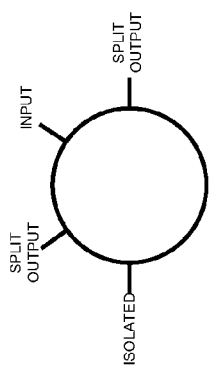
FIG. 3B illustrates an example of a rat-race coupler configured to operate as an in-phase power divider.
Figure 3D:
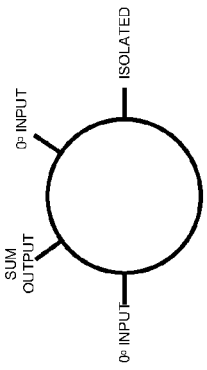
FIG. 3D illustrates an example of a rat-race coupler configured to operate as an in-phase power divider.
Figure 3A:
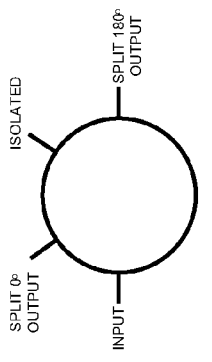
FIG. 3A illustrates an example of a rat-race coupler configured to operate as a 180° power divider.
Figure 3C:
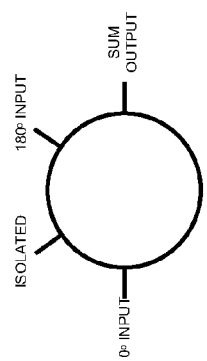
FIG. 3C illustrates an example of a rat-race coupler configured to operate as a 180° power combiner.
Figure 2:
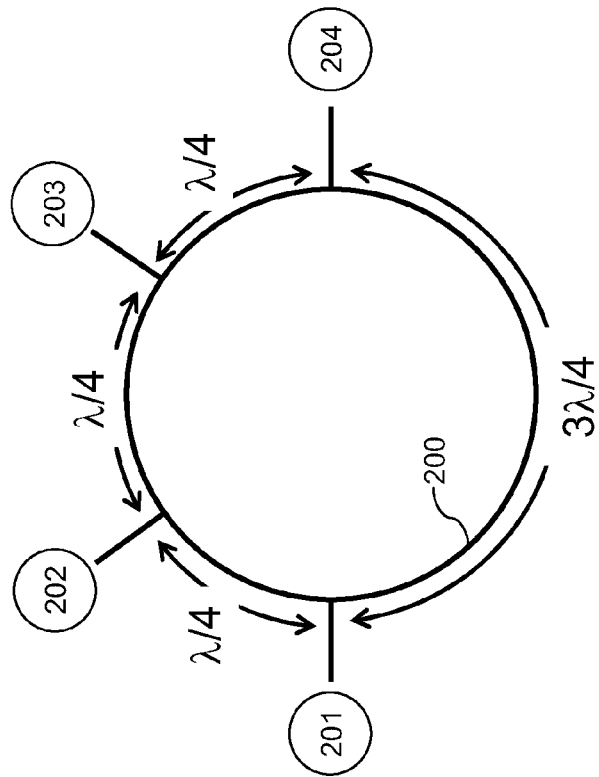
FIG. 2 illustrates schematically an example of a hybrid ring coupler.

FIG. 2 illustrates schematically a rat-race coupler. The rat-race coupler comprises a centre conductor ring 200 with a circumference of 1½ wavelengths ($\lambda$), and four arms/ports 201, 202, 203, 204, distributed around the top half of the ring with a $\lambda/4$ separation. The bottom half of the ring is $3\lambda/4$ in length. A signal incident on any of the ports is divided into two equal components at the junction of the port and the ring, with one component travelling in a clockwise direction around the ring and the other component travelling in an anti-clockwise direction around the ring.

If only a single input is provided, then each of the components will travel around the ring to the next nearest port where the signals will be output. As such, the ports adjacent to the input port will each provide an output signal of equal power. However, depending upon which port was the input port, the signals will be either in-phase or $\pi$ radians (180°) out of phase. At the remaining distant port, the two components will arrive $\pi$ radians (180°) out of phase, resulting in destructive interference, such that no output will be obtained from the distant port. The distant port is therefore said to be isolated. In such a configuration the rat-race coupler therefore operates as a power divider.

If two inputs are provided at alternate ports of a rat-race coupler, then each of these inputs will be split into two equal components travelling in different directions around the ring. At one of the intermediate ports, the clockwise component of a first one of the inputs will meet the anti-clockwise component of the second of the inputs. At the other of the intermediate ports, the anti-clockwise component of first input will meet the clockwise component of the second input. At one of the intermediate ports, the components will be in-phase and constructive interference will therefore occur, such that the sum of the two input signals will be output at that port. At the other of the intermediate ports, the components will be out of phase and therefore destructive interference will occur, such that no output will be obtained from that port (i.e. the port will be isolated). Which of the ports is isolated and which of the ports outputs the sum depends upon whether the two inputs are in-phase or $\pi$ radians (180°) out of phase. FIGS. 3A to 3D illustrate the four possible port configurations of a rat-race coupler and the resultant outputs.

FIG. 4 illustrates an apparatus 400 for power equalisation and phase correction of two signals that comprises two hybrid-ring rat-race couplers 401, 402. The first rat-race coupler 401 is configured to operate as a power combiner for summing two input signals. The first rat-race coupler is also configured such that its output will be provided as the input to the second rat-race coupler 402. The second rat-race coupler 402 is configured to operate as a power divider, splitting the input signal into two output signals of equal power that are π radians (180°) out of phase.

As illustrated in FIG. 4, the first of the ports 403 distributed around half of the first rat-race coupler 401 is provided with a first of the two drive signals ($V_{in}-$) as an input. The second port 404 is coupled to ground via a 50 ohm resistor. The third port 405 is provided with a second of the two drive signals ($V_{in}+$) as an input. The fourth and final port 406 is coupled to the input port of the second rat-race coupler 402. The first rat-race coupler is therefore configured to sum the inputs on the first port 403 and third port 405, with this sum being output ($V_{out1}$) on the fourth port 406. The third port 404 is isolated.

The first of the ports 407 distributed around one half of the second rat-race coupler 402 is provided with the output of the first rat-race coupler ($V_{out1}$) as an input. The second port 408 provides a first output ($V_{out}+$). The third port 409 is coupled to ground via a 50 ohm resistor. The fourth and final port 410 provides a second output ($V_{out}-$). The second rat-race coupler is configured to equally split the input ($V_{out1}$) received from the first rat-race coupler on the first port 407, with each of the split signals being output on the second port 408 and the fourth port 410 respectively. The third port 409 is isolated.

Considering the operation of the dual rat-race structure when provided with two signals having equal power and anti-phase (i.e. a perfect differential signal), these signals can be represented by:

$$V_{in}+ = V_1 \sin(\omega t + \theta_1) \qquad \text{Equation 1}$$

$$V_{in}- = V_2 \sin(\omega t + \theta_2) \qquad \text{Equation 2}$$

Where V is the amplitude of a signal, ω is the angular frequency and θ is the phase, such that $V_1=V_2=V$ and $\theta_1-\theta_2=180°$. When these two signals are provided as inputs to the first rat-race coupler 401 on the first port 403 and third port 405, the first rat-race coupler 401 outputs the sum of the two signals on the fourth port 406:

$$V_{out1} = (V_{in}+) + (V_{in}-) = 2V \sin(\omega t) \qquad \text{Equation 3}$$

This output signal is then provided as an input to the second rat-race coupler 402 on the first port 407. The second rat-race coupler 402 performs 3 dB splitting of the signal into two signals of equal amplitude and opposite phase, such that the outputs on the second port 408 and the fourth port 410 are given by:

$$V_{out} += \frac{2V}{\sqrt{2}} \sin(\omega t + 90°) \qquad \text{Equation 4}$$

$$V_{out} -= \frac{2V}{\sqrt{2}} \sin(\omega t + 270°) \qquad \text{Equation 5}$$

Considering now the operation of the dual rat-race structure when provided with an imperfect differential signal, where $V_1 \neq V_2$ and $\theta_1-\theta_2 \neq 180°$, the output of the first rat-race coupler 401 on the fourth port 406 is:

$$V_{out1} = (V_{in}+) + (V_{in}-) = V_{sum} \sin(\omega t) \qquad \text{Equation 6}$$

where $V_{sum}$ is the sum of the balanced components of the two signals. The unbalanced amplitude and phase components of the two signals go to ground through the isolated port 404. This output signal is then provided as an input to the second rat-race coupler 402 on the first port 407. The second rat-race coupler 402 performs 3 dB splitting of the signal into two signals of equal amplitude and opposite phase, such that the outputs on the second port 408 and the fourth port 410 are given by:

$$V_{out} += \frac{V_{sum}}{\sqrt{2}} \sin(\omega t + 90°) \qquad \text{Equation 7}$$

$$V_{out} -= \frac{V_{sum}}{\sqrt{2}} \sin(\omega t + 270°). \qquad \text{Equation 8}$$

As the imbalanced components of $V_{in}+$ and $V_{in}-$ have been filtered to ground, the final output power will be lower than that produced using two balanced differential inputs. However, these outputs are of equal amplitude and are π radians (180°) out of phase. This dual rat-race structure therefore provides power equalisation and phase correction of a high frequency differential signal, such that the non-perfect 180° phase difference between the input signals is corrected at the output and the power of the two outputs is balanced within the operational bandwidth. This is particularly important for 40 Gbps and 100 Gbps optical transmission systems in which a high frequency differential signal is required to drive a pulse carver for RZ modulation. The pulse carver 103 would therefore also include the apparatus 400 in order to perform power equalisation and differential phase recovery of the drive signals received from the clock source 110.

Furthermore, this dual rat-race structure is passive and could be designed as part of the transmission line, therefore significantly reducing the cost of component manufacture in comparison to circuits that use amplifiers for power equalisation and skew correction. In addition, an amplifier could also be provided on the track between the first rat-race coupler and the second rat-race coupler, whilst still providing a reduction in manufacturing cost over circuits that employ a differential amplifier or an amplifier on each arm of a pulse carver.

Figure 4A:
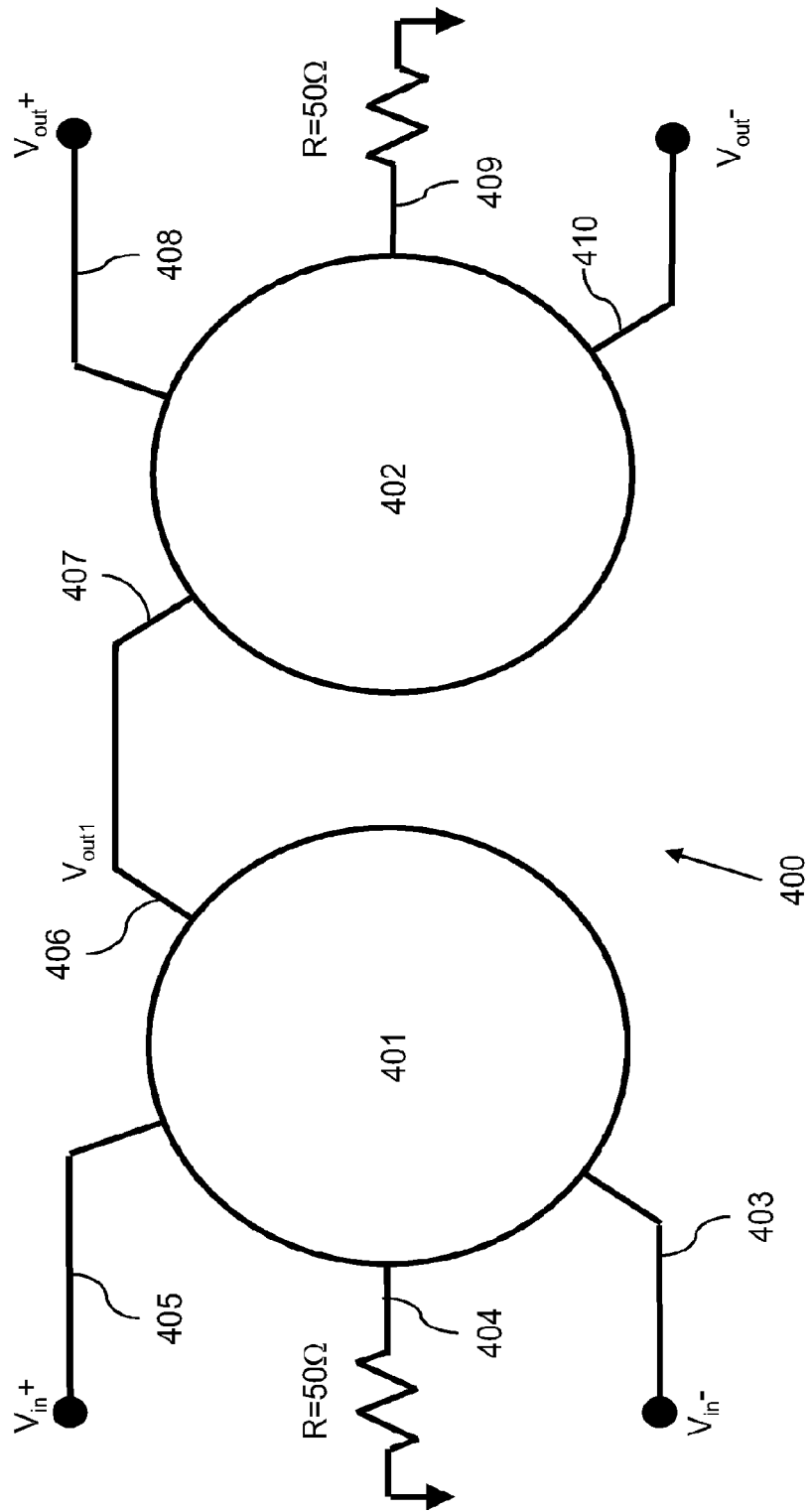
FIG. 4A illustrates an apparatus for performing power equalisation and phase correction of two signals.
Figure 4B:
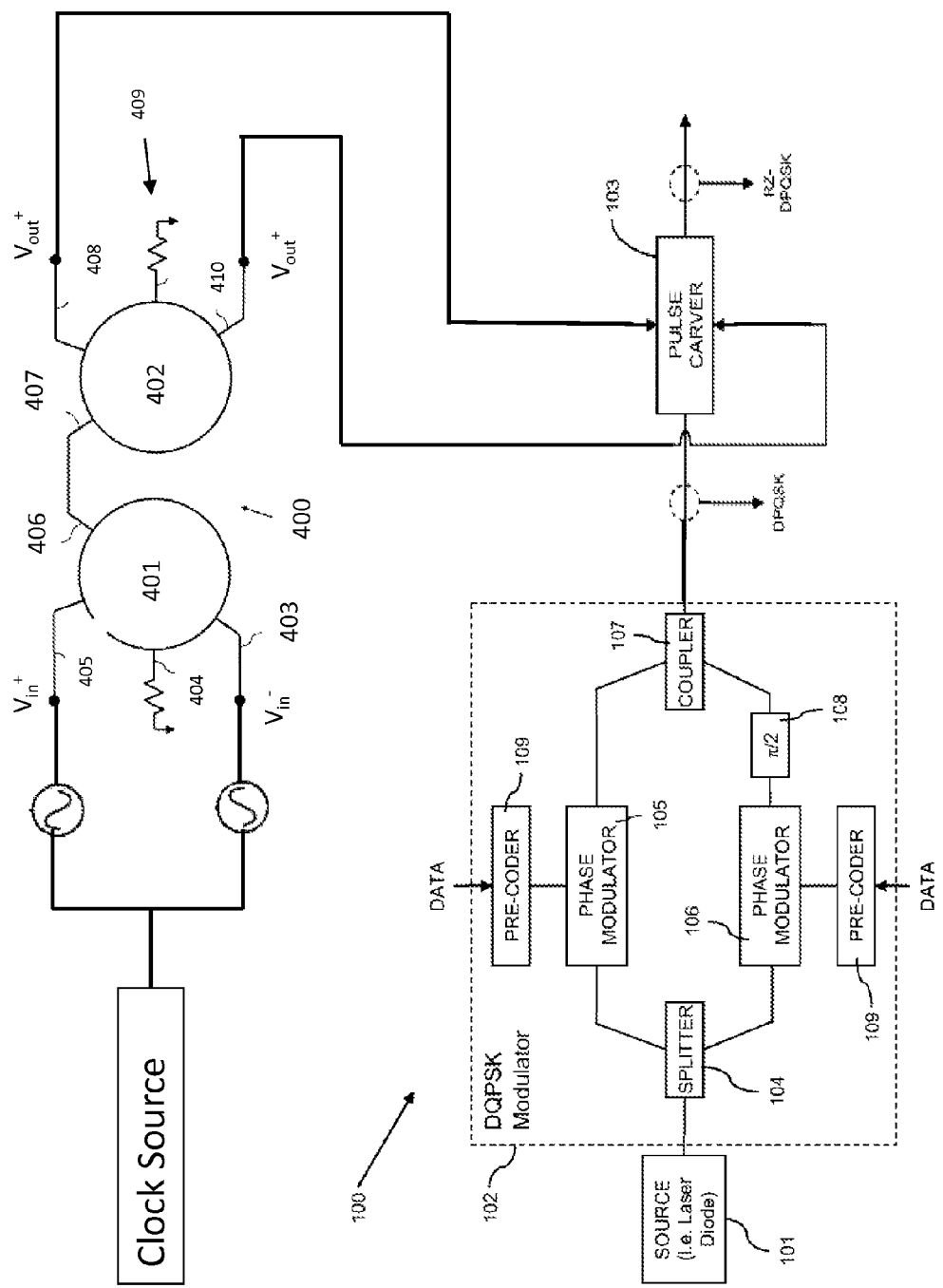
FIG. 4B illustrates an example Return-to-Zero Differential Quadrature Phase-Shift Keying transmitter incorporating the apparatus of FIG. 4A.

FIG. 4B illustrates an example Return-to-Zero Differential Quadrature Phase-Shift Keying transmitter incorporating the apparatus of FIG. 4A.

Figure 5:
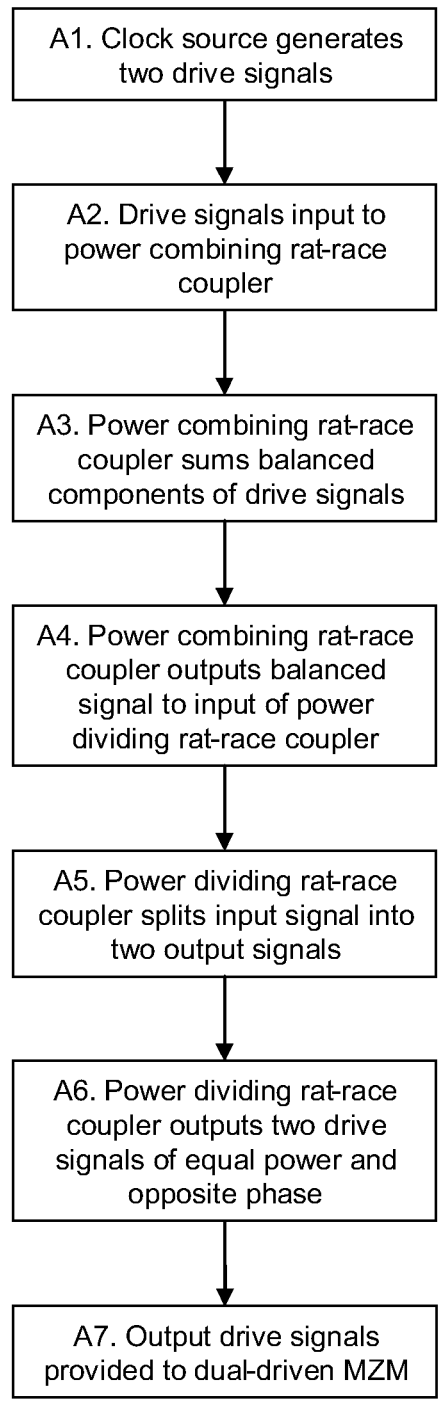
FIG. 5 is a flow diagram illustrating the process of performing power equalisation and phase correction of two signals used for driving a dual-driven MZM operating as a pulse carver.

FIG. 5 is a flow diagram illustrating the process of performing power equalisation and phase correction of two signals that are to be used for driving a dual-driven MZM operating as a pulse carver. The steps performed are as follows:

A1. A clock source generates two drive signals. However, the two drive signals require power equalisation and phase control before they can be used, as they are not of equal power and are not exactly 180° out of phase.

A2. The drive signals are provided as inputs to the first rat-race coupler 401, configured to operate as a power combiner, on the first port 403 and third port 405.

A3. The first rat-race coupler 401 then sums the balanced components of the two drive signals. The unbalanced amplitude and phase components of the two drive signals go to ground through the isolated port 404.

A4. The first rat-race coupler 401 then outputs the sum of the balanced components on the fourth port 406, as an input to the second rat-race coupler 402.

A5. The second rat-race coupler 402 splits the input signal into two output signals that are of equal power and that are π radians (180°) out of phase.

A6. The second rat-race coupler 402 outputs the two outputs signals on the second port 408 and the fourth port 410 respectively.

A7. The two drive signals are now of equal power and are deskewed such that they are 180° out of phase and can be used to drive a dual-driven MZM operating as a pulse carver.

Although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims. For example, whilst the embodiment described above makes use of two rat-race couplers, the object of the invention can be achieved using any two hybrid couplers provided that a first hybrid coupler is configured to operate as a power combiner and to provide its output as an input to a second hybrid coupler, the second hybrid coupler being configured to operate as a power divider for splitting its input into two outputs of equal amplitude. Each feature disclosed or illustrated in the present specification may be incorporated in the invention, whether alone or in any appropriate combination with any other feature disclosed or illustrated herein.

The invention claimed is:

1. An apparatus for performing power equalisation and phase correction of two imperfectly differential electrical signals so as to produce two signals of substantially equal amplitude and substantially opposite phase, the apparatus comprising:
    a first 180° hybrid coupler comprising:
        a first input port and a second input port separated from the first input port by a distance corresponding to a phase shift of 180° in the electrical signals;
        an output port separated from the first input port by a distance corresponding to a phase shift of 90° in the electrical signals and separated from the second input port by a distance corresponding to a phase shift of 270° in the electrical signals;
    a second 180° hybrid coupler comprising:
        an input port;
        a first output port separated from the input port by a distance corresponding to a phase shift of 90° in the electrical signals; and
        a second output port separated from the input port by a distance corresponding to a phase shift of 270° in the electrical signals;
    wherein the output port of the first 180° hybrid coupler is electrically connected to the input port of the second 180° hybrid coupler.

2. An apparatus as claimed in claim 1, wherein the second 180° hybrid coupler is configured to split an input signal into two output signals of equal power.

3. An apparatus as claimed in claim 1, wherein the first 180° hybrid coupler is configured to sum two input signals that are 180° out of phase.

4. An apparatus as claimed in claim 1, wherein the second 180° hybrid coupler is configured to split an input signal into two signals that are 180° out of phase.

5. An apparatus as claimed in claim 1, wherein one or both of the first 180° hybrid coupler and the second 180° hybrid coupler are rat-race couplers.

6. A method for performing power equalisation and phase correction of a first and a second imperfectly differential electrical signal so as to produce two signals of substantially equal amplitude and substantially opposite phase, the method comprising:
    providing the first signal as an input to a first input port of a first 180° hybrid coupler, and the second signal to a second input port of the first 180° hybrid coupler separated from the first input port by a distance corresponding to a phase shift of 180° in the electrical signals; and
    providing an output comprising a sum of the first and the second signals at the output port of the first 180° hybrid coupler, the output port being separated from the first input port by a distance corresponding to a phase shift of 90° in the electrical signals and separated from the second input port by a distance corresponding to a phase shift of 270° in the electrical signals;
    providing the output to an input of a second 180° hybrid coupler;
    splitting the input of the second 180° hybrid coupler between a first and a second output port, the first output port being separated from the input port by a distance corresponding to a phase shift of 90° in the electrical signals and the second output port being separated from the input port by a distance corresponding to a phase shift of 270° in the electrical signals; and
    providing from the output ports two signals of substantially equal power and of substantially opposite phase.

7. A method as claimed in claim 6, wherein the second 180° hybrid coupler splits the output of the first 180° hybrid coupler and outputs two signals of equal power.

8. A method as claimed in claim 6, wherein the second 180° hybrid coupler splits the output of output of the first 180° hybrid coupler into two signals that are 180° out of phase.

9. A method as claimed in claim 6, wherein one or both of the first 180° hybrid coupler and the second 180° hybrid coupler are rat-race couplers.

* * * * *